(12) United States Patent
Yamazaki et al.

(10) Patent No.: US 7,135,741 B1
(45) Date of Patent: Nov. 14, 2006

(54) METHOD OF MANUFACTURING A SEMICONDUCTOR DEVICE

(75) Inventors: Shunpei Yamazaki, Tokyo (JP); Hisashi Ohtani, Kanagawa (JP); Toshiji Hamatani, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/535,015

(22) Filed: Mar. 24, 2000

Related U.S. Application Data

(62) Division of application No. 08/784,294, filed on Jan. 16, 1997, now Pat. No. 6,100,562.

(30) Foreign Application Priority Data

Mar. 17, 1996 (JP) .................................. 8-088759

(51) Int. Cl.
H01L 227/12 (2006.01)
(52) U.S. Cl. ...................... 257/347; 257/642
(58) Field of Classification Search ................ 257/347, 257/49, 50, 51, 52, 63, 64, 65, 506, 59, 72, 257/642
See application file for complete search history.

(56) References Cited

U.S. PATENT DOCUMENTS

| | | | |
|---|---|---|---|
| 3,389,024 A | 6/1968 | Schimmer | |
| 3,783,049 A | 1/1974 | Sandera | |
| RE28,385 E | 4/1975 | Mayer | |
| RE28,386 E | 4/1975 | Heiman et al. | |
| 3,890,632 A | 6/1975 | Ham et al. | |
| 4,059,461 A | 11/1977 | Fan et al. | |
| 4,068,020 A | 1/1978 | Reuschel | |
| 4,132,571 A | 1/1979 | Cuomo et al. | |
| 4,140,548 A * | 2/1979 | Zimmer | 148/1.5 |
| 4,174,217 A | 11/1979 | Flatley | |
| 4,226,898 A | 10/1980 | Ovshinsky et al. | |
| 4,231,809 A | 11/1980 | Schmidt | |
| 4,271,422 A | 6/1981 | Ipri | |
| 4,277,884 A | 7/1981 | Hsu | |
| 4,300,989 A | 11/1981 | Chang | |
| 4,309,224 A | 1/1982 | Shibata | |
| 4,330,363 A | 5/1982 | Biegesen et al. | |
| 4,331,709 A | 5/1982 | Risch et al. | |
| 4,379,020 A | 4/1983 | Glaeser et al. | |
| 4,409,724 A | 10/1983 | Tasch, Jr. et al. | |

(Continued)

FOREIGN PATENT DOCUMENTS

EP 0 178 447 10/1984

(Continued)

OTHER PUBLICATIONS

R.J. Nemanich et al, "Structure and Growth of the Interface of Pd on α-SiH", The American Physical Society—Physical Review, vol. 22, No. 12, pp. 6828-6831, Jun. 1981.

(Continued)

Primary Examiner—Sara Crane
(74) Attorney, Agent, or Firm—Eric J. Robinson; Robinson Intellectual Property Law Office, P.C.

(57) ABSTRACT

A first heat treatment for crystallization is implemented after introducing nickel to an amorphous silicon film 103 disposed on a quartz substrate 101. A crystal silicon film 105 is obtained by this heat treatment. Then, a oxide film 106 is formed by wet oxidation. At this time, the nickel element is gettered to the oxide film 106 by an action of fluorite. Then, the oxide film 106 is removed. Thereby, a crystal silicon film 107 having low concentration of the metal element and a high crystallinity can be obtained.

32 Claims, 6 Drawing Sheets

U.S. PATENT DOCUMENTS

| | | |
|---|---|---|
| 4,466,073 A | 8/1984 | Boyan et al. |
| 4,472,458 A | 9/1984 | Sirinyan et al. |
| 4,481,121 A | 11/1984 | Barthel |
| 4,511,800 A | 4/1985 | Harbeke et al. |
| 4,534,820 A | 8/1985 | Mori et al. |
| 4,544,418 A | 10/1985 | Gibbons |
| 4,546,376 A | 10/1985 | Nakata et al. |
| 4,597,160 A | 7/1986 | Ipri |
| 4,634,473 A | 1/1987 | Swartz et al. |
| 4,735,824 A | 4/1988 | Yamabe et al. |
| 4,755,481 A | 7/1988 | Faraone |
| 4,759,610 A | 7/1988 | Yanagisawa |
| 4,911,781 A | 3/1990 | Fox et al. |
| 4,959,247 A | 9/1990 | Moser et al. |
| 4,959,700 A | 9/1990 | Yamazaki |
| 4,975,760 A | 12/1990 | Dohjo et al. |
| 4,996,077 A | 2/1991 | Moslehi et al. |
| 4,996,523 A | 2/1991 | Bell et al. |
| 5,043,224 A | 8/1991 | Jaccodine et al. |
| 5,075,259 A | 12/1991 | Moran |
| 5,089,441 A | 2/1992 | Moslehi |
| 5,112,764 A | 5/1992 | Mitra et al. |
| 5,132,754 A | 7/1992 | Serikawa et al. |
| 5,145,808 A | 9/1992 | Sameshima et al. |
| 5,147,826 A | 9/1992 | Liu et al. |
| 5,173,446 A | 12/1992 | Asakawa et al. |
| 5,200,630 A | 4/1993 | Nakamura et al. |
| 5,210,050 A * | 5/1993 | Yamazaki et al. .......... 437/101 |
| 5,221,423 A | 6/1993 | Sugino et al. |
| 5,225,355 A | 7/1993 | Sugino et al. |
| 5,244,836 A | 9/1993 | Lim |
| 5,254,480 A | 10/1993 | Tran |
| 5,262,350 A | 11/1993 | Yamazaki et al. |
| 5,262,654 A | 11/1993 | Yamazaki |
| 5,275,851 A | 1/1994 | Fonash et al. |
| 5,278,093 A | 1/1994 | Yonehara |
| 5,289,030 A | 2/1994 | Yamazaki et al. |
| 5,296,405 A | 3/1994 | Yamazaki et al. |
| 5,298,075 A | 3/1994 | Lagendijk et al. |
| 5,300,187 A | 4/1994 | Lesk et al. |
| 5,306,651 A | 4/1994 | Masumo et al. |
| 5,308,998 A | 5/1994 | Yamazaki et al. |
| 5,313,075 A | 5/1994 | Zhang et al. |
| 5,313,076 A * | 5/1994 | Yamazaki et al. ............. 257/66 |
| 5,352,291 A | 10/1994 | Zhang et al. |
| 5,354,697 A | 10/1994 | Oostra et al. |
| 5,358,907 A | 10/1994 | Wong |
| 5,365,080 A * | 11/1994 | Yamazaki et al. ............. 257/66 |
| 5,366,926 A | 11/1994 | Mei et al. |
| 5,372,860 A * | 12/1994 | Fehlner et al. ............... 427/578 |
| 5,387,530 A | 2/1995 | Doyle et al. |
| 5,402,141 A | 3/1995 | Haim et al. |
| 5,403,772 A | 4/1995 | Zhang et al. |
| 5,424,230 A | 6/1995 | Wakai |
| 5,426,064 A | 6/1995 | Zhang et al. |
| 5,470,763 A | 11/1995 | Hamada |
| 5,480,811 A | 1/1996 | Chiang et al. |
| 5,481,121 A | 1/1996 | Zhang et al. |
| 5,488,000 A * | 1/1996 | Zhang et al. ................. 437/21 |
| 5,492,843 A | 2/1996 | Adachi et al. |
| 5,501,989 A | 3/1996 | Takayama et al. |
| 5,504,019 A | 4/1996 | Miyasaka et al. |
| 5,508,207 A | 4/1996 | Horai et al. |
| 5,508,533 A | 4/1996 | Takemura |
| 5,529,937 A | 6/1996 | Zhang et al. |
| 5,530,266 A | 6/1996 | Yonehara et al. |
| 5,531,182 A | 7/1996 | Yonehara |
| 5,531,862 A | 7/1996 | Otsubo et al. |
| 5,534,716 A | 7/1996 | Takemura |
| 5,535,471 A | 7/1996 | Guldi |
| 5,543,352 A | 8/1996 | Ohtani et al. |
| 5,543,636 A | 8/1996 | Yamazaki |
| 5,550,070 A | 8/1996 | Funai et al. |
| 5,563,426 A | 10/1996 | Zhang et al. |
| 5,569,610 A | 10/1996 | Zhang et al. |
| 5,569,936 A | 10/1996 | Zhang et al. |
| 5,575,883 A | 11/1996 | Nishikawa |
| 5,580,792 A | 12/1996 | Zhang et al. |
| 5,580,815 A | 12/1996 | Hsu et al. |
| 5,585,291 A | 12/1996 | Ohtani et al. |
| 5,589,694 A | 12/1996 | Takayama et al. |
| 5,591,988 A | 1/1997 | Arai et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,610,737 A | 3/1997 | Akiyama et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,619,044 A | 4/1997 | Makita et al. |
| 5,620,910 A | 4/1997 | Teramoto |
| 5,621,224 A | 4/1997 | Yamazaki et al. |
| 5,624,851 A | 4/1997 | Takayama et al. |
| 5,627,086 A | 5/1997 | Noguchi |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,661,056 A | 8/1997 | Takeuchi |
| 5,661,311 A | 8/1997 | Takemura et al. |
| 5,663,077 A | 9/1997 | Adachi et al. |
| 5,677,549 A | 10/1997 | Takayama et al. |
| 5,684,317 A | 11/1997 | Hwang |
| 5,684,365 A | 11/1997 | Tang et al. |
| 5,686,328 A | 11/1997 | Zhang et al. |
| 5,693,541 A | 12/1997 | Yamazaki et al. |
| 5,693,959 A | 12/1997 | Inoue et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,704,986 A | 1/1998 | Chen et al. |
| 5,705,829 A | 1/1998 | Miyanaga et al. |
| 5,712,191 A | 1/1998 | Nakajima et al. |
| 5,717,224 A | 2/1998 | Zhang |
| 5,728,259 A | 3/1998 | Suzawa et al. |
| 5,728,610 A | 3/1998 | Gosain et al. |
| 5,734,179 A | 3/1998 | Chang et al. |
| 5,744,822 A | 4/1998 | Takayama et al. ............. 257/66 |
| 5,744,824 A | 4/1998 | Kousai et al. ................. 257/74 |
| 5,756,364 A | 5/1998 | Tanaka et al. |
| 5,763,899 A | 6/1998 | Yamazaki et al. |
| 5,766,977 A | 6/1998 | Yamazaki .................... 438/151 |
| 5,773,327 A | 6/1998 | Yamazaki et al. .......... 438/154 |
| 5,773,846 A | 6/1998 | Zhang et al. ................. 257/66 |
| 5,773,847 A | 6/1998 | Hayakawa ................... 257/66 |
| 5,782,665 A | 7/1998 | Weisfield et al. |
| 5,786,796 A | 7/1998 | Takayama et al. |
| 5,795,795 A | 8/1998 | Kousai et al. ............... 437/174 |
| 5,808,321 A | 9/1998 | Mitanaga et al. ............. 257/72 |
| 5,811,327 A | 9/1998 | Funai et al. ................. 438/166 |
| 5,818,076 A | 10/1998 | Zhang et al. |
| 5,821,138 A | 10/1998 | Yamazaki et al. ........... 438/166 |
| 5,821,560 A | 10/1998 | Arai et al. |
| 5,824,574 A | 10/1998 | Yamazaki et al. .......... 438/150 |
| 5,828,429 A | 10/1998 | Takemura |
| 5,838,508 A | 11/1998 | Sugawara |
| 5,843,225 A | 12/1998 | Takayama et al. |

| | | |
|---|---|---|
| 5,846,857 A | 12/1998 | Ju |
| 5,849,611 A | 12/1998 | Yamazaki et al. |
| 5,869,363 A | 2/1999 | Yamazaki et al. |
| 5,882,960 A | 3/1999 | Zhang et al. |
| 5,888,857 A | 3/1999 | Zhang et al. |
| 5,888,858 A | 3/1999 | Yamazaki et al. |
| 5,893,730 A | 4/1999 | Yamazaki et al. |
| 5,895,933 A | 4/1999 | Zhang et al. |
| 5,899,547 A | 5/1999 | Yamazaki et al. |
| 5,902,993 A | 5/1999 | Okushiba et al. |
| 5,913,111 A * | 6/1999 | Kataoka et al. ............. 438/163 |
| 5,922,125 A | 7/1999 | Zhang |
| 5,929,464 A | 7/1999 | Yamazaki et al. |
| 5,929,527 A | 7/1999 | Yamazaki et al. |
| 5,932,893 A | 8/1999 | Miyanaga et al. |
| 5,933,205 A | 8/1999 | Yamazaki et al. |
| 5,940,690 A | 8/1999 | Kusumoto et al. |
| 5,940,732 A | 8/1999 | Zhang |
| 5,949,107 A | 9/1999 | Zhang |
| 5,953,597 A | 9/1999 | Kusumoto et al. |
| 5,962,869 A | 10/1999 | Yamazaki et al. |
| 5,963,278 A | 10/1999 | Yamazaki et al. |
| 5,970,327 A | 10/1999 | Makita et al. |
| 5,985,740 A | 11/1999 | Yamazaki et al. |
| 5,990,491 A | 11/1999 | Zhang |
| 5,990,542 A | 11/1999 | Yamazaki |
| 6,005,648 A | 12/1999 | Zhang et al. |
| 6,006,763 A | 12/1999 | Mori et al. |
| 6,011,275 A | 1/2000 | Ohtani et al. |
| 6,011,277 A | 1/2000 | Yamazaki |
| 6,013,929 A | 1/2000 | Ohtani |
| 6,031,249 A | 2/2000 | Yamazaki et al. |
| 6,048,758 A | 4/2000 | Yamazaki et al. |
| 6,063,654 A | 5/2000 | Ohtani |
| 6,071,764 A | 6/2000 | Zhang et al. |
| 6,077,731 A | 6/2000 | Yamazaki et al. |
| 6,077,758 A | 6/2000 | Zhang et al. |
| 6,083,801 A | 7/2000 | Ohtani |
| 6,093,934 A | 7/2000 | Yamazaki et al. |
| 6,100,562 A | 8/2000 | Yamazaki et al. |
| 6,121,683 A | 9/2000 | Yamazaki et al. |
| 6,133,073 A | 10/2000 | Yamazaki et al. |
| 6,140,165 A | 10/2000 | Zhang et al. |
| 6,147,667 A | 11/2000 | Yamazaki et al. |
| 6,162,704 A | 12/2000 | Yamazaki et al. |
| 6,175,348 B1 | 1/2001 | Zhang et al. |
| 6,177,302 B1 | 1/2001 | Yamazaki et al. |
| 6,180,439 B1 | 1/2001 | Yamazaki et al. |
| 6,194,254 B1 | 2/2001 | Takemura |
| 6,207,969 B1 | 3/2001 | Yamazaki |
| 6,225,152 B1 | 5/2001 | Yamazaki et al. |
| 6,278,132 B1 | 8/2001 | Yamazaki et al. |
| 6,288,412 B1 | 9/2001 | Hamada et al. |
| 6,294,441 B1 | 9/2001 | Yamazaki |
| 6,323,071 B1 | 11/2001 | Zhang et al. |
| 6,323,072 B1 | 11/2001 | Yamazaki et al. |
| 6,331,718 B1 | 12/2001 | Yamazaki et al. |
| 6,337,232 B1 | 1/2002 | Kusumoto et al. |
| 6,338,991 B1 | 1/2002 | Zhang et al. |
| 6,413,805 B1 | 7/2002 | Zhang et al. |
| 6,423,586 B1 | 7/2002 | Yamazaki et al. |
| 6,455,401 B1 | 9/2002 | Zhang et al. |
| 6,461,943 B1 | 10/2002 | Yamazaki et al. |
| 6,465,287 B1 | 10/2002 | Yamazaki et al. |
| 6,478,263 B1 | 11/2002 | Yamazaki et al. |
| 6,482,686 B1 | 11/2002 | Takemura |
| 6,495,404 B1 | 12/2002 | Teramoto et al. |
| 6,528,358 B1 | 3/2003 | Yamazaki et al. |
| 6,541,795 B1 | 4/2003 | Kusumoto et al. |
| 6,620,711 B1 | 9/2003 | Yamazaki |
| 2002/0025659 A1 | 2/2002 | Yamazaki et al. |
| 2002/0048891 A1 | 4/2002 | Yamazaki et al. |

FOREIGN PATENT DOCUMENTS

| | | |
|---|---|---|
| JP | 60-105216 | 6/1985 |
| JP | 61-063017 | 4/1986 |
| JP | 61-063107 | 4/1986 |
| JP | 62-169356 | 7/1987 |
| JP | 64-081324 | 3/1989 |
| JP | 01-187814 | 7/1989 |
| JP | 01-187874 | 7/1989 |
| JP | 01-187875 | 7/1989 |
| JP | 01-206632 | 8/1989 |
| JP | 02-140915 | 5/1990 |
| JP | 02-148687 | 6/1990 |
| JP | 02-275641 | 11/1990 |
| JP | 03-280418 | 12/1991 |
| JP | 03-280420 | 12/1991 |
| JP | 05-082442 | 4/1993 |
| JP | 05-107561 | 4/1993 |
| JP | 05-291220 | 11/1993 |
| JP | 05-299339 | 11/1993 |
| JP | 05-299348 | 11/1993 |
| JP | 06-232059 | 8/1994 |
| JP | 06-314785 | 11/1994 |
| JP | 06-314787 | 11/1994 |
| JP | 07-045519 | 2/1995 |
| JP | 07-066425 | 3/1995 |
| JP | 07-094757 | 4/1995 |
| JP | 07-161634 | 6/1995 |
| JP | 07-192998 | 7/1995 |
| JP | 07-231100 | 8/1995 |
| JP | 07-321339 | 12/1995 |
| JP | 07-335900 | 12/1995 |
| JP | 07-335906 | 12/1995 |
| JP | 08-045839 | 2/1996 |
| JP | 08-045840 | 2/1996 |
| JP | 96-005879 | 2/1996 |
| JP | 08-097169 | 4/1996 |
| JP | 08-129358 | 5/1996 |
| JP | 08-129359 | 5/1996 |
| JP | 08-129360 | 5/1996 |
| JP | 08-234683 | 9/1996 |
| JP | 08-241047 | 9/1996 |
| JP | 08-241048 | 9/1996 |
| JP | 08-241057 | 9/1996 |
| JP | 08-241997 | 9/1996 |

OTHER PUBLICATIONS

M.J. Thompson et al, "Silicide Formation in Pd-α-Si:H Schottky Barriers", Appl. Phys. Lett., vol. 39, No. 3, pp. 274-276, Aug. 1981.

Hayashi et al., "Fabrication of Low-Temperature Bottom-Gate Poly-Si TFTs on Large-Area Substrate by Linear-Beam Excimer Laser Crystallization and Ion Doping Method", IEEE IEDM 1995, pp. 829-832.

R.J. Nemanich et al, "Initial Phase Formation at the Interface of Ni, Pd, or Pt and Si", Mat. Res. Soc. Symp. Proc., vol. 25, 1984.

Baker, Jr. et al. "Field Effect Transistor", pp. 849, 1968, IBM Technical Disclosure Bulletin, vol. 11, No. 7.

Wolf, Silicon Processing for the VLSI ERA, vol. 2: Process Integration, p. 274, (1990).

Caune et al., "Combined CW Laser and Furnace Annealing of Amorphous Si and Ge in Contact With Some Metals", Jan. 1, 1989, pp. 597-604, Applied Surface Schience, vol. 36.

Stoemnos et al., "Crystallization of Amorphous Silicon By Reconstructive Transformation Utilizing Gold", Mar. 18, 1991, pp. 1196-1198, Appl. Phys. Lett. 58(11).

Kakkad et al., "Crystallized Si-Films By Low-Temperature Rapid Thermal Annealing of Amorphous Silicon", Mar. 1, 1989, pp. 2069-2072, J. Appl. Phys. 65(5).

Oki et al., "Effect of Deposited Metals On the Crystallization Temperature of Amorphous Germanium Film", 1969, pp. 1056, Jpn. J. Appl. Phys. 8.

Kuznetsov et al., "Enhanced Solid Phase Epitaxial Recrystallization of Amorphous Silicon Due to Nickel Silicide Precipitation Resulting From Ion Implantation and Annealing", 1993, pp. 990-993, Nucl. Instruments Methods Physics Research, 880/881.

Takenaka et al., "High Mobility Poly-Si Thin Film Transistors Using Phase Crystallized a-Si Films Deposited by Plasma Enhanced Chemical Vapor Deposition", Dec. 1990, pp. L2380-L2383, Jpn. J. Appl. Phys. vol. 29, No. 12.

Hatalis et al., "High Performance Thin-Film Transistors in Low Temperature Crystallized LPCVD Amorphous Silicon Films", Aug. 1987, pp. 361-364, Elec. Dev. Letters vol. EDL 8, No. 8.

Zorabedian et al., "Lateral Seeding of Silicon-on-Insulator Using an Ellipitical Laser Beam: A Comparison of Scanning Methods", 1984, pp. 81-86, Mat. Res. Soc. Symp. Proc. vol. 33.

Spaepen et al., "Metal-Enhanced Growth of Silicon", 1992, pp. 483-499, Crucial Issues in Semiconductor Materials & Processing Technologies.

Green et al., "Method To Purify Semiconductor Wafers", Oct. 1973, pp. 1612-1613, IBM Tech. Discl. Bulletin vol. 16, No. 5.

Boyd et al., "Oxidation of Silcon Surfaces by CO2 Lasers", Jul. 15, 1982, pp. 162-164, Applied Phys. Letters, vol. 41. No. 2.

Wolf et al., "Silicon Processing for the VLSI Era Volume 1: Process Technology", 1986, pp. 215-216, Lattice Press.

Lau et al., "Solid Phase Epitaxy in Silicide Forming System", 1977, pp. 313-322, Thin Solid Films, 47.

Kawazu et al., "Low-Temperature Crystallization of Hydrogenated Amorphous Silicon Induced by Nickel Silicide Formation", Dec. 1990, pp. 2698-2704, Inst. of Appl. Phys. vol. 29, No. 12.

Wolf et al., "Silicon Processing for the VLSI Era Volume 1—Process Technology", 1986, pp. 550-551, Lattice Press.

Bruines et al., "Between Explosive Crystallization and Amorphous Regrowth: Inhomogeneous Solidification Upon Pulsed Laser Annealing of Amorphous Silicon", Mar. 1, 1987, pp. 507-509, Applied Physics Letter, vol. 50.

Kawazu et al., "Initial Stage of the Interfacial Reaction between Nickel and Hydrogenated Amorphous Silicon", Apr. 1, 1990, pp. 729-738, Japanese Journal of Appl Phys., vol. 29.

Kakkad et al., "Low Temperature Selective Crystallization of Amorphous Silicon", 1989, pp. 66-68, Journal of Non-Crystaline Solids, 115.

Suresh et al., "Electroless Plated Nickel Contacts to Hydrogenated Amorphous Silicon", Jan. 1, 1994, pp. 78-81, Thin Solid Films, vol. 252.

Sakaguchi et al., "Current Progress in Epitaxial Layer Transfer", Mar. 1, 1997, pp. 378-387, IEICE Trans. Electron, vol. E80 C/No. 3.

Kouvatsos et al., "Fluorine-enhanced Oxidation of Polycrystalline Silicon and Application to Thin-Film Transistor Fabrication", Aug. 24, 1992, pp. 937-939, Appl. Phys. Letter, vol. 61, No. 8.

Sze, "VLSI Technology", Jan. 1, 1988, pp. 397-400, McGraw-Hill Publishing Company, Second Edition.

Ghandi, "VLSI Fabrication Principles", Jan. 1, 1983, pp. 419-429, Wiley and Sons.

Kuper et al., "Effects of Fluorine Implantation on the Kinetics of Dry Oxidation of Silicon", Aug. 1, 1986, pp. 985-990, J. Applied Physics.

Wolf et al., "Silicon Processing for the VLSI Era vol. 1: Process Technology", 1986, pp. 198-207, Lattice Press.

Hemple et al., "Needle-Like Crystallization of Ni Doped Amorphous Silicon Thim Films", 1993, pp. 921-924, Solid State Communications, vol. 85, No. 11.

Kuo, "Thin Film Transistor Technologies", vol. 94-35, pp. 116-122, The Electrochemical Society Proceedings.

Author Unknown, "Thermo Auto-chrome Full Color Recording Technology", May 31, 1995, pp. Unknown, Technology Information Association.

Wolf et al., "Thermal Oxidation of Single Crystal Silicon", 1986, pp. 207-211, Silicon Processing for the VLSI Era.

Erokhin et al., "Spatially Confined Nickel Disilicide Formation at 400c on Ion Implantation Preamorphized Silicon", Dec. 6, 1993, pp. 3173-3175, Appl. Phys. Lett. 63 (23).

Dvurechenskii et al., "Transport Phenomena in Amorphous Silicon Doped by Ion Implantation of 3d Metals", 1986, pp. 635-640, Akademikian Lavrentev Prospekt 13, 630090 Novosibirsk 90, USSR.

Batstone et al., "Microscopic Processes in Crystallisation", Jan. 1, 1994, pp. 257-268, Solid State Phenomena, vol. 37-38.

Cammarata et al., "Silicide Precipitation and Silicon Crystallization in Nickel Implanted Amorphous Silicon Thin Films". Oct. 10, 1990, pp. 2133-2138, J. Mater. Res. vol. 5, No. 10.

Hayzelden et al., "Silicide Formation and Silicide Mediated Crystallization of Nickel-Implanted Amorphous Silicon Thin Films", May 15, 1993, pp. 8279-8289, J. Appl. Phys. 73(12).

Kuznetsov et al., "Silicide Precipitate Formation and Solid Phase Re-Growth of Ni-Implanted Amorphous Silicon", Apr. 5-8, 1993, pp. 191-194, Inst. Phys. Conf. Ser. No. 134.4: Procedings of Royal Microscopical Society Conf.

Liu et al., "Polycrystalline Silicon Thin Film Transistors on Corning 7059 Glass Substrates Using Short Time, Low-Temperature Processing", May 17, 1993, pp. 2554-2556, Appl. Phys. Lett. 62(20).

Liu et al., "Selective Area Crystallization of Amorhpous Silicon Films by Low-Temperature Rapid Thermal Annealing", Aug. 14, 1989, pp. 660-662, Appl Phs. Lett 55(7).

Specification, claims, abstract of U.S. Appl. No. 09/699,466, filed Oct. 31, 2000, Yamazaki et al.

Nemanich, R.J. et al., *Structure and Growth of the Interface of Pd on a-SiH*, The American Physical Society - Physical Review, vol. 23, No. 12, pp. 6828-6831, Jun. 1981.

Nemanich, R.J. et al., *Structure and Growth of the Interface of Pd on a-SiH*, The American Physical Society - Physical Review, vol. 23, No. 12, pp. 6828-6831, Jun. 15 1981.

Stoemenos et al., *Crystallization of Amorphous Silicon by Reconstructive Transformation Utilizing Gold*, Appl. Phys. Lett., vol. 58, No. 11, Mar. 18. 1991, pp. 1196-1198.

Kuznetsov et al., *Enhanced Solid Phase Epitaxial Recrystallization of Amorphous Silicon Due to Nickel Silicide Precipitation Resulting from Ion Implantation and Annealing*, Nuclear Instruments and Methods in Physics Research, 880/881, 1993, pp. 990-993.

Hatalis et al., *High Performance Thin-Film Transistors in Low Temperature Crystallized LPCVD Amorphous Silicon Films*, IEEE Electron Device Letters, vol. EDL 8, No. 8, Aug. 1987, pp. 361-364.

Lau et al., *Solid Phase Epitaxy Silicide-Forming Systems*, Thin Solid Films, vol. 47, No. 3, 1977, pp. 313-322.

Kawazu et al., *Initial Stage of the Interfacial Reaction Between Nickel and Hydrogenated Amorphous Silicon*, Japanese Journal of Applied Physics, vol. 29, No. 4, Apr. 1, 1990, pp. 729-738.

Hempel et al., *Needle-Like Crystallization of Ni Doped Amorphous Silicon Thin Films*, Solid State Communications, vol. 85, No. 11, 1993, pp. 921-924.

Wolf et al., *Silicon Processing for the VLSI Era*, vol. 1: Process Technology, Lattice Press, 1986, pp. 207-211.

Dvurechenskii et al., *Transport Phenomena in Amorphous Silicon Doped by Ion Implantation of 3d Metals*, Phys. Stat. Sol. (a), vol. 95, No. 635, 1986, pp. 635-640.

Hayzelden et al., *Silicide Formation and Silicide Mediated Crystallization of Nickel-Implanted Amorphous Silicon Thin Films*, J. Appl. Phys., vol. 73, No. 12, Jun. 15, 1993, pp. 8279-8289.

Kuznetsov et al., *Silicide Precipitate Formation and Solid Phase Re-Growth of Ni-Implanted Amorphous Silicon*, Inst. Phys Conf. Ser. No. 134.4: Proceedings of the Royal Microscopical Society Conf., Apr. 5-8, 1993 pp. 191-194.

Baker, Jr. et al., *Field Effect Transistor*, IBM Technical Disclosure Bulletin, vol. 11, No. 7, Dec. 1968, p. 849.

Wolf, *Silicon Processing for the VLSI Era*, vol. 2: Process Integration, 1990, pp. 273-274.

Caune et al., *Combined CW Laser and Furnace Annealing of Amorphous Si and Ge in Contact with Some Metals*, Applied Surface Science, vol. 36, Jan. 1, 1989, pp. 597-604.

* cited by examiner

FORMATION OF AMORPHOUS SILICON FILM AND INTRODUCTION OF NI ELEMENT

HEAT TREATMENT FOR CRYSTALLIZATION

IRRADIATION OF LASER LIGHT

FORMATION OF WET OXIDE FILM CONTAINING FLUORITE

REMOVAL OF OXIDE FILM CONTAINING NI

HEAT TREATMENT FOR CRYSTALLIZATION

IRRADIATION OF LASER LIGHT

FORMATION OF WET OXIDE FILM
CONTAINING FLUORITE

METHOD OF MANUFACTURING A SEMICONDUCTOR DEVICE

This application is a Divisional of application Ser. No. 08/784,294 filed Jan. 16, 1997 now U.S. Pat. No. 6,100,562.

BACKGROUND OF THE INVENTION

1. Field of the Invention

The present invention relates to an arrangement of a thin film semiconductor device using a crystal silicon film and to a fabrication method thereof.

2. Description of Related Art

Hitherto, there has been known a thin film transistor using a silicon film, i.e. a technology for forming the thin film transistor by using the silicon film formed on a glass substrate or quartz substrate.

The glass substrate or quartz substrate is used because the thin film transistor is used for an active matrix type liquid crystal display. While a thin film transistor has been formed by using an amorphous silicon film in the past, it is being tried to fabricate the thin film transistor by utilizing a silicon film having a crystallinity (referred to as "crystal silicon film" hereinbelow) in order to enhance its performance.

The thin film transistor using the crystal silicon film allows to operate at higher speed by more than two digits as compared to one using the amorphous silicon film. Therefore, peripheral driving circuits of an active matrix type liquid crystal display which have been composed of external IC circuits may be built on the glass substrate or quartz substrate in the same manner with the active matrix circuit.

Such structure is very advantageous in miniaturizing the whole apparatus and in simplifying the fabrication process, thus leading to the reduction of the fabrication cost.

In general, a crystal silicon film has been obtained by forming an amorphous silicon film by means of plasma CVD or reduced pressure thermal CVD and then by crystallizing it by implementing a heat treatment or by irradiating laser light.

However, it has been the fact that it is difficult to obtain a required crystallinity throughout a wide area through the heat treatment because it may cause nonuniformity in the crystallization.

Further, although it is possible to obtain the high crystallinity partly by irradiating laser light, it is difficult to obtain a good annealing effect throughout the wide area. In particular, the irradiation of the laser light is apt to become unstable under the condition for obtaining the good crystallinity.

Meanwhile, a technology described in Japanese Patent Laid-Open No. Hei. 6-232059 has been known. This is a technology which allows to obtain a crystal silicon film through a heat treatment at a lower temperature than that of the prior art by introducing a metal element (e.g. nickel) which promotes the crystallization of silicon to the amorphous silicon film.

This technology allows high crystallinity to be obtained uniformly throughout a wide area as compared to the prior art crystallization method by way of only heating or crystallization of an amorphous silicon film only by means of irradiation of laser light.

However, it is difficult to obtain a crystal silicon film having high crystallinity and homogeneity throughout a wide area which is required for an active matrix type liquid crystal display.

Further, because the metal element is contained within the film and an amount thereof to be introduced has to be controlled very carefully, there is a problem in its reproducibility and stability (electrical stability of a device obtained).

Still more, there is a problem that an elapsed change of the characteristics of a semiconductor device to be obtained is large or an OFF value, in case of a thin film transistor, is large, for example due to the influence of the remaining metal element.

That is, although the metal element which promotes the crystallization of silicon plays the useful role in obtaining the crystal silicon film, its existence becomes a minus factor which causes various problems after obtaining the crystal silicon film once.

SUMMARY OF THE INVENTION

It is an object of the invention disclosed in the present specification to provide a semiconductor device having excellent characteristics by using a crystal silicon film having a high crystallinity.

It is another object of the invention to provide a technology for reducing concentration of metal element within a crystal silicon film obtained by utilizing the metal element which promotes crystallization of silicon.

It is still another object of the present invention to provide a technology which can enhance characteristics and reliability of the semiconductor device thus obtained.

The invention disclosed in the present specification is characterized in that the metal element which promotes the crystallization of silicon is gettered by mainly utilizing fluorine. This gettering is carried out by taking the metal element into the thermal oxide film to be formed by an action of fluorine. Then, the invention is characterized in that an oxide film is formed by an action of wet oxidation at this time.

It is general to use $NF_3$ as means for introducing fluorine. $NF_3$ is a strong oxidant and promotes the formation of the thermal oxide film when it is contained in an oxidizing atmosphere in certain concentration.

However, there is a problem when $NF_3$ is used that etching of the surface of the silicon film advances. Especially when the metal element which promotes the crystallization of silicon is used, not a few component of metal silicide exists within the silicon film, so that there arises a problem that the component is removed concentratedly, thus roughening the surface of the silicon film and creating a gap inside.

According to the present invention disclosed in the present specification, fluorine is used just to getter the metal element. The oxide film is formed by the action of the wet oxidation by containing hydrogen within the atmosphere.

Due to the wet oxidation, the oxide film is minute and fairly flat and a film forming rate may be improved as compared to a simple thermal oxide film.

According to the present invention disclosed in the present specification, chlorine is also contained in the atmosphere in order to promote the effect of gettering the metal. The effect of eliminating the metal element from the silicon film may be enhanced by forming a compound of the metal element, fluorine and chlorine at the time of gettering by introducing chlorine.

Thus, the gettering of the metal element into the oxide film thus formed by the oxidation utilizing the action of the wet oxidation introducing hydrogen is carried out by the action of fluorine and chlorine.

Thereby, the metal element may be gettered without roughening the surface of the film or etching it locally. Then, the crystal silicon film having the high crystallinity and having low concentration of the metal element which promotes the crystallization of silicon may be obtained.

As the method for forming the oxide film to eliminate the metal element which promotes the crystallization of silicon in the present invention disclosed in the present specification, the following combinations may be cited.

Firstly, a heat treatment within an oxygen atmosphere into which 1 to 5% of HCl and 10 ppm to 200 ppm of $NF_3$ are added may be cited.

Secondly, a heat treatment within an oxygen atmosphere into which 3% of hydrogen and 50 ppm to 200 ppm of $NF_3$ are added may be cited.

Thirdly, a heat treatment within an oxygen atmosphere into which 3% of hydrogen and 50 ppm to 100 ppm of $ClF_3$ are added may be cited.

In the heat treatments under the above-mentioned conditions, the oxide film is formed due to the contribution that the wet oxide film is formed mainly by the action of oxygen and hydrogen. Then, the effect of gettering the metal element into the oxide film is exerted by the action of the elements such as F and Cl.

A first embodiment of the present invention is characterized in that it comprises steps of forming an amorphous silicon film; holding a metal element which promotes crystallization of silicon in contact on the surface of the amorphous silicon film; crystallizing the amorphous silicon film by implementing a first heat treatment to obtain a crystal silicon film; forming a thermal oxide film on the surface of the crystal silicon film by implementing a second heat treatment in the temperature range of 500° C. to 700° C. within an atmosphere containing oxygen, hydrogen and fluorine; and eliminating the thermal oxide film.

A second embodiment of the present invention is characterized in that it comprises steps of forming an amorphous silicon film; holding a metal element which promotes crystallization of silicon in contact on the surface of the amorphous silicon film; crystallizing the amorphous silicon film by implementing a first heat treatment to obtain a crystal silicon film; forming a thermal oxide film on the surface of the crystal silicon film by implementing a second heat treatment in the temperature range of 500° C. to 700° C. within an atmosphere containing oxygen, hydrogen, fluorine and chlorine; and eliminating the thermal oxide film.

A third embodiment of the present invention is characterized in that it comprises steps of forming an amorphous silicon film; holding a metal element which promotes crystallization of silicon in contact on the surface of the amorphous silicon film; crystallizing the amorphous silicon film by implementing a heat treatment to obtain a crystal silicon film; forming a wet oxide film on the surface of the crystal silicon film within an atmosphere containing fluorine/chlorine; and eliminating the oxide film.

In the above-mentioned arrangement, the concentration of said metal element within said oxide film formed on the crystal silicon film is higher than that of said metal element within said crystal silicon film because the metal element is gettered to the oxide film.

Hydrogen added to the oxidizing atmosphere in forming the oxide film is preferable to be more than 1% (volume %) to form the oxide film through the contribution of wet oxidation. The upper limit of the concentration is preferable to set to be below the explosion limit.

One or a plurality elements selected from Fe, Co, Ni, Ru, Rh, Pd, Os, It, Pt, Cu and Au may be used as the metal element which promotes the crystallization of silicon. It is preferable to use Ni (nickel) from its reproducibility and high effect.

The concentration of oxygen contained in the amorphous silicon film, i.e. the starting film, is preferable to be $5 \times 10^{17}$ $cm^{-3}$ to $2 \times 10^{19}$ $cm^{-3}$. This is an important condition for obtaining the effect of gettering the metal element which promotes the crystallization of silicon.

An arrangement of fourth embodiment of the present invention is characterized in that in a semiconductor device having a silicon film having a crystallinity, the silicon film contains a metal element which promotes crystallization of silicon in concentration of $1 \times 10^{16}$ $cm^{-3}$ to $5 \times 10^{18}$ $cm^{-3}$, fluorine atoms in concentration of $1 \times 10^{15}$ $cm^{-3}$ to $1 \times 10^{20}$ $cm^{-3}$, and hydrogen atoms in concentration of $1 \times 10^{17}$ $cm^{-3}$ to $1 \times 10^{21}$ $cm^{-3}$.

The concentration of impurity and element in the present specification is defined as the minimum value of measured values measured by the SIMS (secondary ion mass spectrometry).

BRIEF DESCRIPTION OF THE DRAWINGS

The accompanying drawings, which are incorporated in and form a part of the invention and together with the description serve to explain the principle of the invention.

DETAILED DESCRIPTION OF THE PREFERRED EMBODIMENTS

Figure 1A:
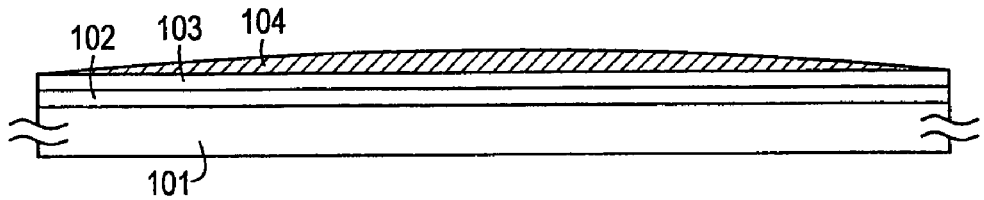
FIG. 1 is a diagram showing steps for obtaining a crystal silicon film.

According to a preferred mode for carrying out the invention disclosed in the present specification, an amorphous silicon film is formed on a glass substrate at first. Then, the amorphous silicon film is crystallized by an action of metal element typified by nickel which promotes crystallization of silicon to obtain a crystal silicon film. This crystallization is carried out by a heat treatment in a temperature of 500° C. to 700° C. The metal element is contained in the crystal silicon film in the state in which the film has been crystallized by the above-mentioned heat treatment.

Next, another heat treatment is implemented within an oxidizing atmosphere containing hydrogen and $NF_3$. In this step, a thermal oxide film is formed mainly due to the contribution of wet oxidation and the metal element is gettered to the oxide film by the action of F (fluorine).

Next, the crystal silicon film having the high crystallinity and having low concentration of the metal element may be obtained by eliminating the thermal oxide film containing the metal element in high concentration.

Then, a thin film semiconductor device, e.g. a thin film transistor, is fabricated by using the crystal silicon film in which the concentration of the metal element is low.

Preferred Embodiment 1

The present embodiment relates to a case of obtaining a crystal silicon film on a glass substrate by utilizing nickel element.

According to the present embodiment, the crystal silicon film having a high crystallinity is obtained by the action of nickel element at first.

Then, laser light is irradiated to enhance the crystallinity of the film and to diffuse the nickel element which is concentrated locally within the film, i.e. to reduce or to distinguish blocks of nickel.

Next, an oxide film containing F (fluorine) is formed on the crystal silicon film by thermal oxidation. At this time, the nickel element remaining in the crystal silicon film is gettered to the thermal oxide film by the action of F element. At this time, because the nickel element is dispersed therein by the irradiation of laser light, the gettering proceeds effectively.

Then, the thermal oxide film containing the nickel element in high concentration as a result of the gettering is eliminated. Thereby, the crystal silicon film in which the concentration of nickel element is low, while having the high crystallinity, is obtained on the glass substrate.

A fabrication process of the present embodiment will be explained by using FIG. 1 below. At first, a silicon oxide film or a silicon oxide nitride film 102 is formed as an underlying film in a thickness of 3000 angstrom on the glass substrate 101 of Corning 1737 (distortion point: 667° C.).

The silicon oxide film formed in a thickness of 3000 angstrom by sputtering by is used.

The silicon oxide film has a function of suppressing the diffusion of impurities from the glass substrate in the later steps. It also has a function of relaxing stress which acts between the glass substrate and a silicon film formed later.

It is also effective to include a small amount of halogen element in the underlying film 102. Thereby, the metal element which promotes crystallization of silicon and which exists within the semiconductor layer may be gettered by the halogen element in the later step.

It is also effective to add a hydrogen plasma treatment after forming the underlying film, because it has an effect of eliminating carbonate which exists on the surface of the underlying film and of suppressing a level of fixed charge from being existing at the interface between the silicon film to be formed later.

It is also effective to implement a plasma treatment in an atmosphere in which oxygen and hydrogen are mixed as an alternate method of the hydrogen plasma treatment.

Next, an amorphous silicon film 103, which turns out to be a crystal silicon film later, is formed in a thickness of 500 angstrom by the reduced pressure thermal CVD. The reason why the reduced pressure thermal CVD is used is because thereby, the quality of the crystal silicon film obtained later is better, i.e. the film quality is denser in concrete. Beside the reduced pressure thermal CVD, the plasma CVD may be used.

The amorphous silicon film fabricated here is desirable to have $5 \times 10^{17}$ cm$^{-3}$ to $2 \times 10^{-9}$ cm$^{-3}$ of concentration of oxygen within the film. It is because oxygen plays an important role in the later step of gettering the metal element (gettering of nickel in case of the present embodiment) which promotes crystallization of silicon.

However, it must be careful here because the crystallization of the amorphous silicon film is hampered if the oxygen concentration is higher than the above-mentioned range of concentration. When the concentration of oxygen is lower than the above-mentioned concentration range on the other hand, the contribution of the metal element to the gettering effect becomes small.

The concentration of other impurities such as those of nitrogen and carbon is preferred to be low to the utmost. In concrete, the concentration is preferably below $2 \times 10^{19}$ cm$^{-3}$.

The upper limit of the thickness of the amorphous silicon film is about 2000 angstrom. It is because it is disadvantageous to have a thick film to obtain the effect of laser irradiated later. Thick film is disadvantageous because the laser light irradiated to the silicon film is absorbed almost by the surface of the film.

The lower limit of the amorphous silicon film 103 is practically about 200 angstrom, though it depends on how to form it. If the thickness is below that, there will be problem in the uniformity of the film.

Next, nickel element is introduced to the amorphous silicon film 103 to crystallize it. Here, the nickel element is used as the metal element which promotes the crystallization of silicon. The nickel element is introduced by using solution.

Here, the nickel element is introduced by applying nickel acetate solution containing 10 ppm (reduced to weight) of nickel on the surface of the amorphous silicon film 103.

Beside the method of using the above-mentioned solution, sputtering, CVD, plasma treatment or adsorption may be used as the method for introducing the nickel element.

The method of using the solution is useful in that it is simple and that the concentration of the metal element may be readily adjusted.

The solution of nickel acetate salt is applied as described above to form a water film (liquid film) 104 as shown in FIG. 1A. In this state, extra solution is blown out by using a spin coater not shown. Thus, the nickel element is held in contact on the surface of the amorphous silicon film 103.

The amount of the nickel element introduced to the amorphous silicon film 103 may be controlled also by adjusting a time for holding the water film 104 and by conditions for eliminating it by using the spiner.

It is noted that it is preferable to use nickel sulfate solution for example, instead of using the nickel acetate, if the remained impurities in the later heating process is taken into consideration. It is because the nickel acetate contains carbon and it might be carbonized in the later heating process, thus remaining within the film.

Figure 1B:
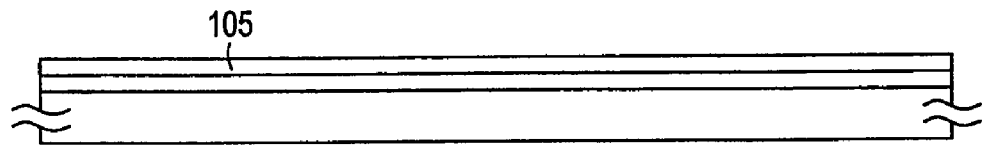

Next, a heat treatment is implemented in the temperature range from 500° C. to 700° C. in the state shown in FIG. 1B to crystallize the amorphous silicon film 103 and to obtain a crystal silicon film 105. This heat treatment is implemented in a nitrogen atmosphere containing 3% of hydrogen at 640° C. for four hours.

It is preferable to implement the heat treatment below the temperature of the distortion point of the glass substrate. Because the distortion point of the Corning 1737 glass substrate is 667° C., the upper limit of the heating temperature here is preferable to be about 650° C., leaving some margin.

The reason why the reducing atmosphere is adopted in the crystallization step in a way of the heat treatment is to prevent oxides from being created in the step of the heat treatment and more concretely, to suppress nickel from reacting with oxygen and NiOx from being created on the surface of the film or within the film.

Oxygen couples with nickel and contributes a lot in gettering nickel in the later gettering step. However, it has been found that if oxygen couples with nickel in the above-mentioned stage of the crystallization, it hampers the crystallization. Accordingly, it is important to suppress the oxides from being created to the utmost in the crystallization step carried out by way of heating.

The concentration of oxygen within the atmosphere for implementing the heat treatment for the crystallization has to be in an order of ppm, or preferably, less than 1 ppm.

Inert gases such as argon, beside nitrogen, may be used as the gas which occupies the most of the atmosphere for implementing the heat treatment for the crystallization.

After the crystallization step by way of the heat treatment, nickel element remains as certain blocks. This fact has been confirmed from the observation by means of TEM (transmission electron microscope).

Figure 1C:
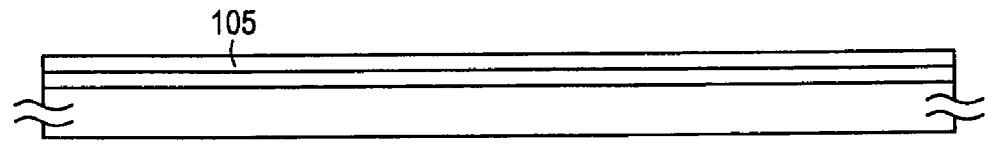

Although the cause of the fact that the nickel exists as certain blocks is not clear yet, it is considered to be related with some crystallization mechanism. Next, laser light is irradiated as shown in FIG. 1C. Here, KrF excimer laser (wavelength: 248 nm) is used. Here, a method of irradiating the laser light by scanning its linear beam is adopted.

The nickel element which has been locally concentrated as a result of the crystallization carried out by way of the aforementioned heat treatment is distributed by a certain degree within the film 105 by irradiating the laser light. That is, the nickel element may be distributed by distinguishing the blocks of the nickel element.

Figure 1D:
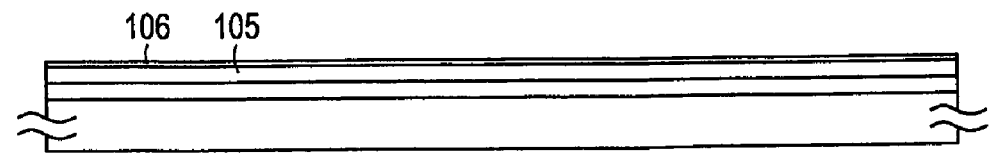

Another heat treatment is implemented in the step shown in FIG. 1D to form a thermal oxide film for gettering the nickel element.

Here, this heat treatment is implemented with an oxygen atmosphere containing 3% of hydrogen and 100 ppm of $ClF_3$ at 640° C. In this step, the thermal oxide film is formed in a thickness of 200 angstrom (FIG. 1D).

This step is carried out to eliminate the nickel element which has been introduced intentionally for the crystallization in the initial stage from the crystal silicon film 105.

This heat treatment is implemented at a temperature range from 500 to 700° C. The upper limit of the heating temperature is limited by the distortion point of the glass substrate used. One must be careful not to implement the heat treatment above the distortion point of the glass substrate because, otherwise, the substrate deforms.

In this step, the nickel element which has been distributed by the above-mentioned irradiation of laser is effectively gettered to the oxide film 106.

Because the nickel element is gettered to the oxide film thus formed in the above-mentioned step, naturally the nickel concentration within the oxide film becomes high as compared to other regions.

Further, it has been observed that the concentration of nickel element is apt to be high near the interface of the crystal silicon film 105 with the oxide film 106. It is considered to happen because the domain where the gettering mainly takes place is on the side of the oxide film near the interface between the silicon film and the oxide film. The gettering proceeding near the interface is considered to be caused by the existence of stress and defects, or organic substances near the interface.

It has been also observed that the concentration of fluorine and chlorine apt to be high near the interface between the silicon film 105 and the thermal oxide film 106.

The crystal silicon film thus formed contains the metal element which promotes crystallization of silicon in concentration of $1\times10^{16}$ $cm^{-3}$ to $5\times10^{18}$ $cm^{-3}$, fluorine atoms in concentration of $1\times10^{15}$ $cm^{-3}$ to $1\times10^{20}$ $cm^{-3}$, and hydrogen atoms in concentration of $1\times10^{17}$ $cm^{-3}$ to $1\times10^{21}$ $cm^{-3}$.

After finishing to form the thermal oxide film 106 shown in FIG. 1D, the thermal oxide film 106 containing nickel in high concentration is eliminated. The thermal oxide film 106 may be eliminated by means of wet etching or dry etching using buffer hydrofluoric acid (or other hydrofluorite etchant).

Figure 1E:
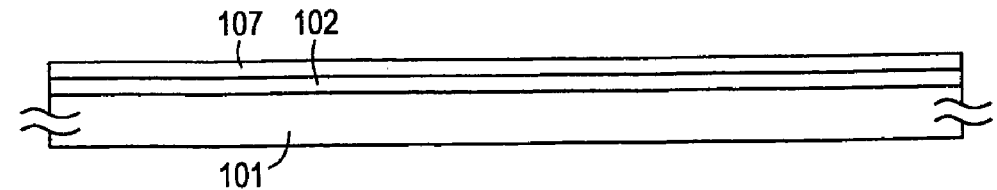

Thus, a crystal silicon film 107 in which the concentration of nickel has been reduced is obtained as shown in FIG. 1E.

Because nickel element is contained near the surface of the obtained crystal silicon film 107 relatively in high concentration, it is effective to advance the above-mentioned etching to over-etch, more or less, the surface of the crystal silicon film 107.

It is also effective to irradiate laser light again after removing the thermal oxide film 106 to promote the crystallinity of the crystal silicon film 107 thus obtained further.

Although the case when the KrF excimer laser (wavelength: 248 nm) is used as the laser to be used has been shown in the present specification, it is possible to use a XeCl excimer laser (wavelength: 308 nm) and other types of excimer lasers.

It is also possible to arrange so as to irradiate ultraviolet rays or infrared rays for example instead of laser light.

Preferred Embodiment 2

The present embodiment relates to a case when Cu is used as the metal element which promotes the crystallization of silicon in the arrangement shown in the first embodiment. In this case, cupric acetate [$Cu(CH_3\ COO)_2$] or cupricchloride ($CuCl_2 2H_2O$) may be used as the solution for introducing Cu.

Preferred Embodiment 3

The present embodiment relates to a case of growing crystal in the form different from that in the first embodiment. That is, the present embodiment relates to a method of growing the crystal in a direction parallel to the substrate, i.e. a method called lateral growth, by utilizing the metal element which promotes crystallization of silicon.

FIG. 2 shows the fabrication process according to the present embodiment. At first, a silicon oxide film or a silicon oxide nitride film is formed as an underlying film 202 in a thickness of 3000 angstrom on the Corning 1737 glass substrate (or a quartz substrate) 201.

Next, an amorphous silicon film 203 which is the starting film of a crystal silicon film is formed in a thickness of 600 angstrom by reduced pressure thermal CVD. The thickness of the amorphous silicon film is preferable to be less than 2000 angstrom as described before.

Next, a silicon oxide film not shown is formed in a thickness of 1500 angstrom and is patterned to form a mask 204. An opening is created on the mask in a domain 205. The amorphous silicon film 203 is exposed at the domain where the opening 205 is created.

The opening 205 has a thin and long rectangular shape in the longitudinal direction from the depth to the front side of the figure. Preferably, the width of the opening 203 is 20 [[*m]] μm or more. The length thereof in the longitudinal direction may be determined arbitrarily.

Then, the nickel acetate aqueous solution containing 10 ppm of nickel element in terms of weight is applied in the same manner with the first embodiment and the extra solution is removed by implementing spin drying by using a spinner not shown.

Figure 2A:
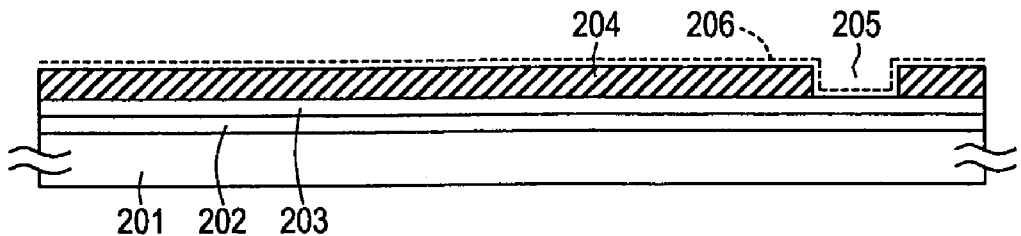
FIG. 2 is a diagram showing steps for obtaining a crystal silicon film.
Figure 2B:
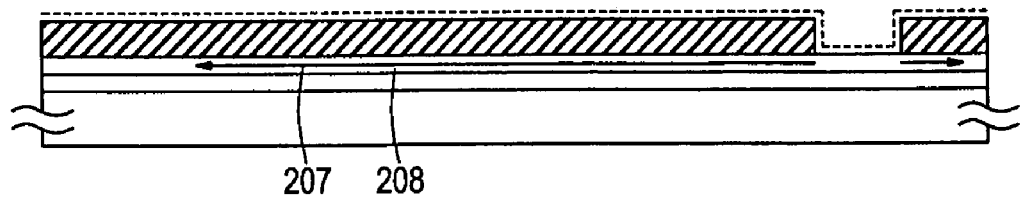

Thus, the solution is held in contact on the exposed surface of the amorphous silicon film 203 as indicated by a dot line 206 in FIG. 2A.

Next, a heat treatment is implemented at 640° C. for four hours in a nitrogen atmosphere containing 3% of hydrogen and in which oxygen is minimized. Then, crystal grows in the direction parallel to the substrate as indicated by the reference numeral 207 in FIG. 2B. This crystal growth advances from the domain of the opening 205 to which nickel element has been introduced to the surrounding part. This crystal growth in the direction parallel to the substrate will be referred to as lateral growth.

It is possible to advance this lateral growth across more than 100 [[≠m]] µm under the conditions shown in the present embodiment. Then, a silicon film 208 having the domain in which the crystal has thus grown laterally is obtained. It is noted that crystal growth in the vertical direction called vertical growth advances from the surface of the silicon film to the underlying interface in the domain where the opening 205 is formed.

Figure 2C:

Then, the mask 204 made of the silicon oxide film for selectively introducing nickel element is eliminated. Thus, the state shown in FIG. 2C is obtained. In this state, the vertically grown domain, the laterally grown domain and a domain in which no crystal has grown (having amorphous state) exist within the silicon film 208.

In this state, the nickel element is unevenly distributed in the film. In particular, the nickel element exists relatively in high concentration at the domain where the aperture 205 has been formed and at the edge portion 207 of the crystal growth.

After obtaining the state shown in FIG. 2C, laser light is irradiated. The KrF excimer laser is irradiated here similarly to the first embodiment.

The nickel element which has been unevenly distributed is diffused in this step to obtain a condition in which it can be gettered readily in the later gettering step.

Figure 2D:
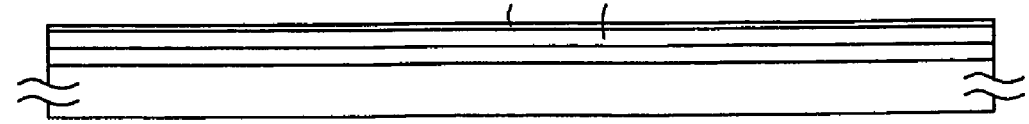

After irradiating the laser light, a heat treatment is implemented at 650° C. for 12 hours within an atmosphere containing 3% of hydrogen and 100 ppm of $NF_3$. In this step, an oxide film 209 containing nickel element in high concentration is formed in a thickness of 200 angstrom. In the same time, the concentration of nickel element within the silicon film 208 may be reduced relatively (FIG. 2D).

After finishing to form the thermal oxide film by the above-mentioned heat treatment, the thermal oxide film 209 containing nickel element in high concentration is eliminated.

It is useful to etch the surface of the crystal silicon film after eliminating the thermal oxide film 209.

Next, patterning is implemented to form a pattern 210 formed of the laterally grown domain.

The concentration of nickel element which remains within the pattern 210 made of the laterally grown domain thus obtained may be reduced further as compared to the case shown in the first embodiment.

This is caused by the fact that the concentration of the metal element contained within the laterally grown domain is low originally. In concrete, the concentration of nickel element within the pattern 209 made of the laterally grown domain may be readily reduced to the order of $10^{17}$ $cm^{-1}$ or less.

Figure 2E:
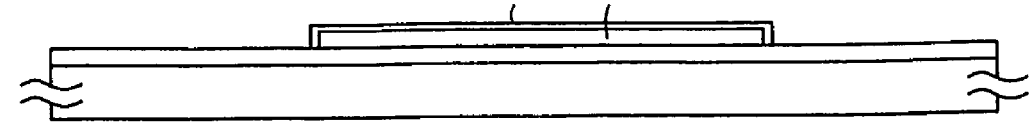

It is noted that it is useful to implement the etching process further after forming the pattern shown in FIG. 2E to eliminate the nickel element existing on the surface of the pattern.

Then, a thermal oxide film 211 is formed after thus forming the pattern 210. This thermal oxide film is formed into a thickness of 200 angstrom by implementing a heat treatment for 12 hours in an oxygen atmosphere at 650° C.

It is also effective to include fluorine within the atmosphere in forming the thermal oxide film 211. If fluorine is included in the atmosphere in forming the thermal oxide film 211, the nickel element may be fixed and unpaired bonds on the surface of the silicon film may be neutralized. That is, the interfacial characteristics between the active layer and the gate insulating film may be improved.

Chlorine may be used instead of Fluorine.

It is noted that the thermal oxide film becomes apart of the gate insulating film later when a thin film transistor is formed.

If the thin film transistor is to be fabricated thereafter, a silicon oxide film is formed further by means of plasma CVD or the like so as to cover the thermal oxide film 211 to form a gate insulating film.

Preferred Embodiment 4

The present embodiment relates to a case of fabricating a thin film transistor disposed in a pixel domain of an active matrix type liquid crystal display or an active matrix type EL display by utilizing the invention disclosed in the present specification.

FIG. 3 shows the fabrication process according to the present embodiment. At first, the crystal silicon film is formed on the glass substrate through the process shown in the first or the third embodiment. When the crystal silicon film is obtained by the arrangement shown in the first embodiment, it is patterned to obtain the state shown in FIG. 3A.

Figure 3A:
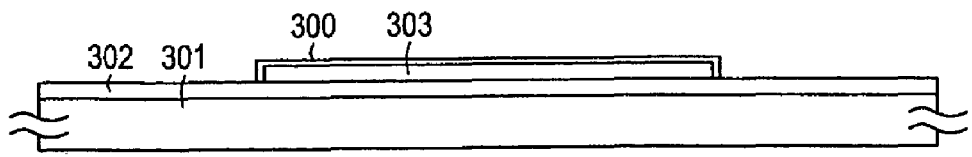
FIG. 3 is a diagram showing steps for fabricating a thin film transistor.

In the state shown in FIG. 3A, the reference numeral (301) denotes a glass substrate, (302) an underlying film, and (303) an active layer formed of the crystal silicon film. After obtaining the state shown in FIG. 3A, a plasma treatment is implemented within a reduced pressure atmosphere in which oxygen and hydrogen are mixed. The plasma is generated by high-frequency discharge.

Organic substances existing on the surface of the exposed active layer 303 may be removed by the above-mentioned plasma treatment. Specifically, the organic substances adsorbing on the surface of the active layer are oxidized by oxygen plasma and the oxidized organic substances are reduced and vaporized further by hydrogen plasma. Thus the organic substances existing on the surface of the exposed active layer 303 are removed.

The removal of the organic substances is very effective in suppressing fixed charge from existing on the surface of the active layer 303. Because the fixed charge caused by the existence of organic substances hampers the operation of the device and renders the characteristics thereof instable, it is very useful to reduce it.

After removing the organic substances, thermal oxidation is implemented within an oxygen atmosphere at 640° C. to form a thermal oxide film 300 of 100 angstrom thick. This thermal oxide film has a high interfacial characteristic with a semiconductor layer and composes a part of a gate insulating film later. Thus, the state shown in FIG. 3A is obtained.

Figure 3B:
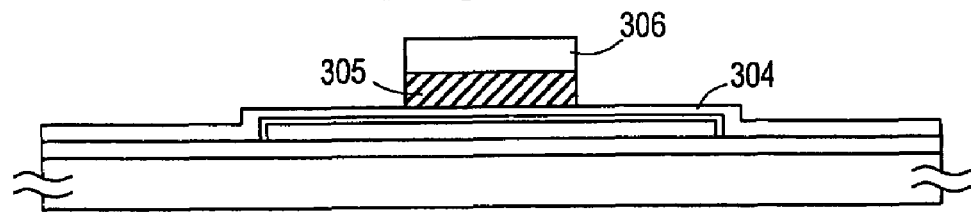
Figure 3C:
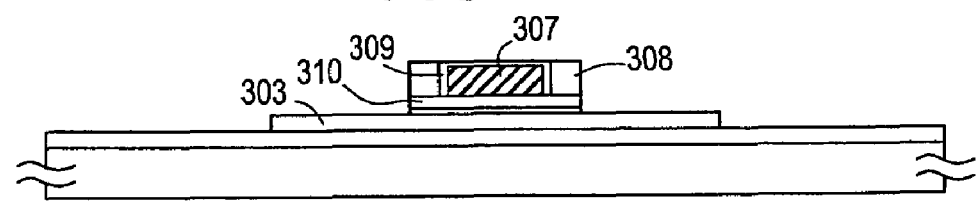

After obtaining the state shown in FIG. 3A, a silicon oxide film 304 which composes the gate insulating film is formed in a thickness of 1000 angstrom. The film may be formed by using plasma CVD (FIG. 3B).

The silicon oxide film 304 functions as the gate insulating film together with the thermal oxide film 300.

It is also effective to contain halogen element within the silicon oxide film 304. In this case, the nickel element may be fixed by the action of the halogen element. Then, it is possible to suppress the function of the gate insulating film as an insulating film from dropping by the influence of the nickel element (or another metal element which promotes crystallization of silicon) existing within the active layer.

After forming the silicon oxide film 304 which functions as the gate insulating film, an aluminum film not shown which functions as a gate electrode later is formed by sputtering. 0.2 weight % of scandium is included within the aluminum film.

Scandium is included in the aluminum film to suppress hillock and whisker from being produced in the later process. The hillock and whisker mean that abnormal growth of aluminum occurs by heating, thus forming needle or prickle-like projections.

After forming the aluminum film, a dense anodic oxide film not shown is formed. The anodic oxide film is formed by using ethylene glycol solution containing 3% of tartaric acid as electrolyte by setting the aluminum film as the anode and platinum as the cathode. The thickness of the anodic oxide film having the dense film quality is around 100 angstrom.

This anodic oxide film plays a role of enhancing the adhesiveness with a resist mask to be formed later.

The thickness of the anodic oxide film may be controlled by adjusting voltage applied during the anodization.

Next, the resist mask 306 is formed and the aluminum film is patterned so as to have a pattern 305. The state shown in FIG. 3B is thus obtained.

Here, another anodization is implemented. In this case, 3% of oxalate aqueous solution is used as electrolyte. A porous anodic oxide film 308 is formed by anodizing within this electrolyte by setting the aluminum pattern 305 as the anode.

In this step, the anodic oxide film 308 is formed selectively on the sides of the aluminum pattern because the resist mask 306 having the high adhesiveness exists thereabove.

The anodic oxide film may be grown up to several [[≯m]] μm thick. The thickness is 6000 angstrom here. It is noted that the range of the growth may be controlled by adjusting an anodizing time.

Next, the resist mask 306 is removed. Then, a dense anodic oxide film is formed again. That is, the anodization is implemented again by using the ethylene glycol solution containing 3% of tartaric acid as electrolyte.

Then, an anodic oxide film 309 having a dense film quality is formed because the electrolyte infiltrates into the porous anodic oxide film 308.

This dense anodic oxide film 309 is 1000 angstrom thick. The thickness is controlled by adjusting applied voltage.

Here, the exposed silicon oxide film 304 and the thermal oxide film 300 are etched by utilizing dry etching. Then, the porous anodic oxide film 308 is eliminated by using mixed acid in which acetic acid, nitric acid and phosphoric acid are mixed. Thus, the state shown in FIG. 3D is obtained.

Figure 3D:
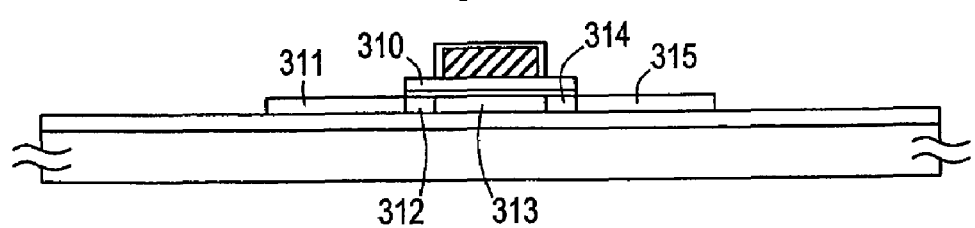

After obtaining the state shown in FIG. 3D, impurity ions are injected. Here, P (phosphorus) ions are injected by plasma doping in order to fabricate an N-channel type thin film transistor.

In this step, heavily doped domains 311 and 315 and lightly doped domains 312 and 314 are formed because part of the remaining silicon oxide film 310 functions as a semi-permeable mask, thus blocking part of the injected ions.

Then, laser light or intense light is irradiated to activate the domains into which the impurity ions have been injected. Thus, a source domain 311, a channel forming domain 313, a drain domain 315 and low concentrate impurity domains 312 and 314 are formed in a manner of self-adjustment.

One designated by the reference numeral 314 here is the domain called the LDD (lightly doped domain) (FIG. 3D).

It is noted that when the dense anodic oxide film 309 is formed as thick as 2000 angstrom or more, an offset gate domain may be formed on the outside of the channel forming domain 313 by its thickness.

Although the offset gate domain is formed also in the present embodiment, it is not shown in the figures because its size is small, its contribution due to the existence thereof is small and the figures might otherwise become complicated.

It must be careful to form the anodic oxide film having the dense quality as thick as 2000 angstrom or more because it requires more than 200 V of applied voltage.

Next, a silicon oxide film or a silicon nitride film or their laminated film is formed as an interlayer insulating film 316. The interlayer insulating film may be constructed by forming a layer made of a resin material on the silicon oxide film or the silicon nitride film.

Figure 3E:
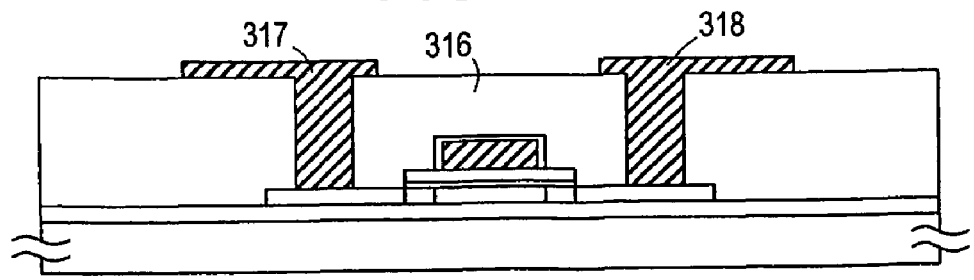

Then, contact holes are created to form a source electrode 317 and a drain electrode 318. Thus, the thin film transistor shown in FIG. 3E is completed.

Preferred Embodiment 5

The present embodiment relates to a case of fabricating a thin film transistor through a process different from that shown in FIG. 3.

FIG. 4 shows the fabrication process according to the present embodiment. At first, the crystal silicon film is formed on the glass substrate through the process shown in the first or third embodiment. It is then patterned, thus obtaining the state shown in FIG. 4A.

Figure 4A:
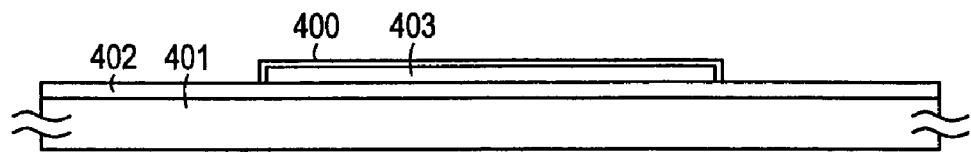
FIG. 4 is a diagram showing steps for fabricating a thin film transistor.

After obtaining the state shown in FIG. 4A, a plasma treatment is implemented within a reduced pressure atmosphere in which oxygen and hydrogen are mixed.

In the state shown in FIG. 4A, the reference numeral (401) denotes a glass substrate, (402) an underlying film, (403) an active layer made of the crystal silicon film and (400) a thermal oxide film formed again after eliminating the thermal oxide film for gettering.

Figure 4B:
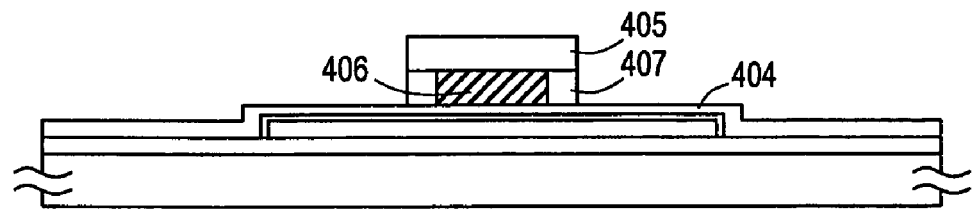
Figure 4C:
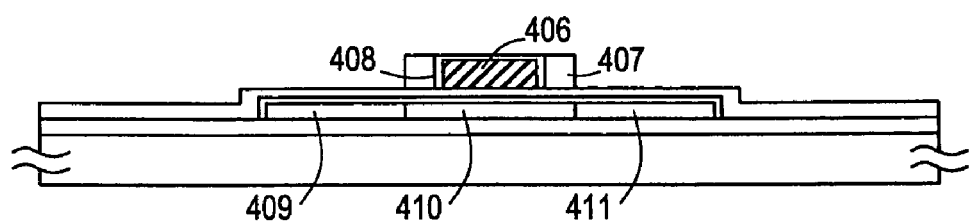

After obtaining the state shown in FIG. 4A, a silicon oxide nitride film 404 which composes a gate insulating is formed in a thickness of 1000 angstrom (FIG. 4B).

The silicon oxide nitride film 404 composes the gate insulating film together with the thermal oxide film 400.

Next, an aluminum film not shown which functions as a gate electrode later is formed by sputtering. 0.2 weight % of scandium is included within the aluminum film.

After forming the aluminum film, a dense anodic oxide film not shown is formed. The anodic oxide film is formed by using ethylene glycol solution containing 3% of tartaric acid as electrolyte.

The thickness of the anodic oxide film not shown having the dense film quality is around 100 angstrom. This anodic oxide film plays a role of enhancing the adhesiveness with a resist mask to be formed later.

It is noted that the thickness of the anodic oxide film may be controlled by adjusting voltage applied during the anodization.

Next, the resist mask 405 is formed and the aluminum film is patterned so as to have a pattern 406.

Here, another anodization is implemented. In this case, 3% of oxalate aqueous solution is used as electrolyte. A porous anodic oxide film 407 is formed by anodizing within this electrolyte by setting the aluminum pattern 406 as the anode.

In this step, the anodic oxide film 407 is formed selectively on the sides of the aluminum pattern because the resist mask 405 having the high adhesiveness exists thereabove.

The anodic oxide film may be grown up to several [[*m]] μm thick. The thickness is 6000 angstrom here. It is noted that the range of the growth may be controlled by adjusting an anodizing time.

Then, the resist mask 405 is removed and another dense anodic oxide film is formed. That is, the anodization is implemented again by using the ethylene glycol solution containing 3% of tartaric acid as electrolyte. Then, an anodic oxide film 408 having a dense film quality is formed because the electrolyte infiltrates into the porous anodic oxide film 407 (FIG. 2C).

Here, the initial injection of impurity ions is implemented. Here, P ions are injected to fabricate an N-channel type thin film transistor. If a P-channel type thin film transistor is to be fabricated, B (boron) ions are injected.

A source domain 409 and a drain domain 411 are formed by injecting the impurity ions. No impurity ion is injected to a domain 410.

Then, the porous anodic oxide film 407 is eliminated by using mixed acid in which acetic acid, nitric acid and phosphoric acid are mixed. Thus, the state shown in FIG. 4D is obtained.

Figure 4D:
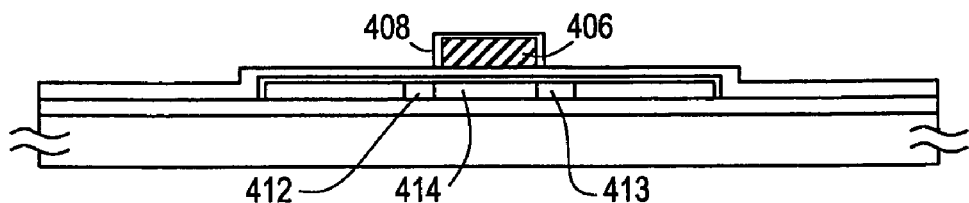

After obtaining the state shown in FIG. 4D, impurity ions (phosphorus ions) are injected again. The impurity ions are injected under the doping condition lighter (lower dosage) than that of the first injection.

In this step, lightly doped domains 412 and 413 are formed and a domain 414 turns out to be a channel forming domain (FIG. 4D).

Then, laser light or intense light is irradiated to activate the domains into which the impurity ions have been injected. Thus, the source domain 409, the channel forming domain 414, the drain domain 411 and low concentrate impurity domains 412 and 413 are formed in a manner of self-adjustment.

Here, one designated by the reference numeral 413 is the domain called the LDD (lightly doped domain) (FIG. 4D).

Next, a silicon oxide film or a silicon nitride film or their laminated film is formed as an interlayer insulating film 415. The interlayer insulating film may be constructed by forming a layer made from a resin material on the silicon oxide film or the silicon nitride film.

Figure 4E:
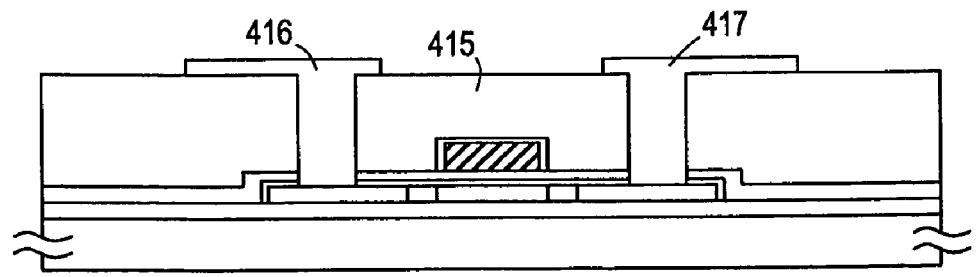

Then, contact holes are created to form a source electrode 416 and a drain electrode 417. Finally, a heat treatment of an hour is implemented within a hydrogen atmosphere at 350° C. (hydrogen heat treatment). In this step, the defects and unpaired bonds within the active layer are neutralized. Thus, the thin film transistor shown in FIG. 4E is completed.

Preferred Embodiment 6

The present embodiment relates to a case when an N-channel type thin film transistor and a P-channel type thin film transistor are formed in a complementary manner.

The arrangement shown in the present embodiment may be utilized for various thin film integrated circuits integrated on an insulated surface as well as for peripheral driving circuits of an active matrix type liquid crystal display for example.

Figure 5A:
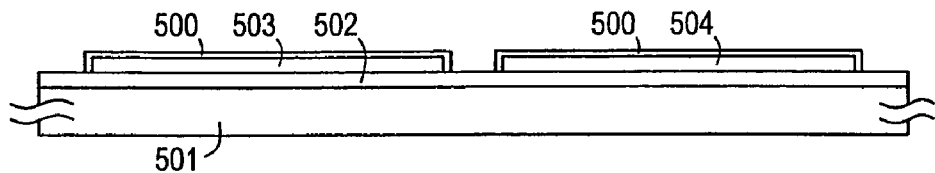
FIG. 5 is a diagram showing steps for fabricating a thin film transistor.

At first, a silicon oxide film or a silicon oxide nitride film is formed as an underlying film 502 on a glass substrate 501 as shown in FIG. 5A.

Next, an amorphous silicon film not shown is formed by the plasma CVD or reduced pressure thermal CVD. Then, the amorphous silicon film is transformed into a crystal silicon film by the same method as shown in the first embodiment.

Next, a plasma treatment is implemented within an atmosphere in which oxygen and hydrogen are mixed. Then, the obtained crystal silicon film is patterned to obtain active layers 503 and 504. After forming the active layers 503 and 504, a thermal oxide film 500 is formed. This thickness of the thermal oxide film 500 is set at about 100 angstrom.

Thus, the state shown in FIG. 5A is obtained. Next, a silicon oxide film 505 which compose the gate insulating film is formed. Then, an aluminum film not shown which composes a gate electrode later is formed in a thickness of 4000 angstrom by sputtering. Beside the aluminum film, a metal which can be anodized (e.g. tantalum) may be used.

After forming the aluminum film, a very thin and dense anodic oxide film not shown is formed on the surface thereof by the method described before.

Next, a resist mask not shown is placed on the aluminum film to pattern the aluminum film. Then, anodization is implemented by setting the obtained aluminum pattern as the anode to form porous anodic oxide films 508 and 509. The thickness of the porous anodic oxide films is 5000 angstrom for example.

Figure 5B:
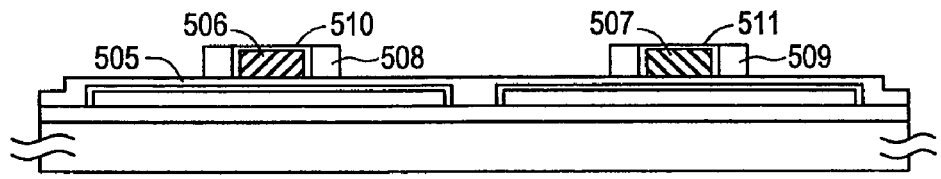

Then, the resist mask not shown is removed and another anodization is implemented under the condition of forming dense anodic oxide films to form dense anodic films 510 and 511. The thickness of the dense anodic oxide films 510 and 511 is 800 angstrom. Thus, the state shown in FIG. 5B is obtained.

Figure 5C:
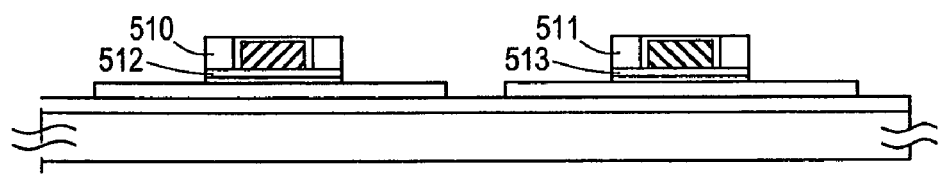

Then, the exposed silicon oxide film 505 and the thermal oxide film 500 are eliminated by dry etching, thus obtaining the state shown in FIG. 5C.

Figure 5D:
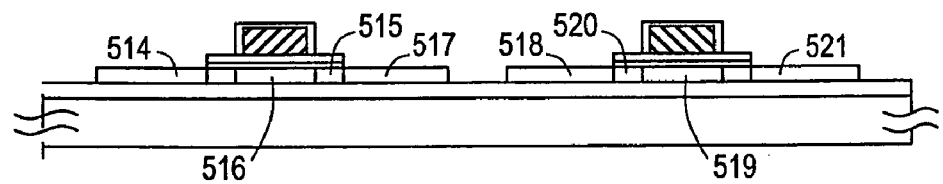

After obtaining the state shown in FIG. 5C, the porous anodic oxide films 508 and 509 are eliminated by using mixed acid in which acetic acid, nitric acid and phosphoric acid are mixed. Thus, the state shown in FIG. 5D is obtained.

Here, resist masks are disposed alternately to inject P ions to the thin film transistor on the left side and B ions to the thin film transistor on the right side.

By injecting those impurity ions, a source domain 514 and a drain domain 517 having N-type in high concentration are formed in a manner of self-adjustment.

Further, a domain 515 to which P ions are doped in low concentration, thus having weak N-type, as well as a channel forming domain 516 are formed in the same time.

The reason why the domain 515 having the weak N-type is formed is because the remaining gate insulating film 512 exists. That is, part of P ions transmitting through the gate insulating film 512 is blocked by the gate insulating film 512.

By the same principle, a source domain 521 and a drain domain 518 having strong P-type are formed in a manner of self-adjustment and a low concentrate impurity domain 520 is formed in the same time. Further, a channel forming domain 519 is formed in the same time.

It is noted that when the thickness of the dense anodic oxide films 510 and 511 is as thick as 2000 angstrom, an offset gate domain may be formed in contact with the channel forming domain by that thickness.

Its existence may be ignored in the case of the present embodiment because the dense anodic oxide films 510 and 511 are so thin as less than 1000 angstrom.

Then, laser light or intense light is irradiated to anneal the domain into which the impurity ions have been injected.

Figure 5E:
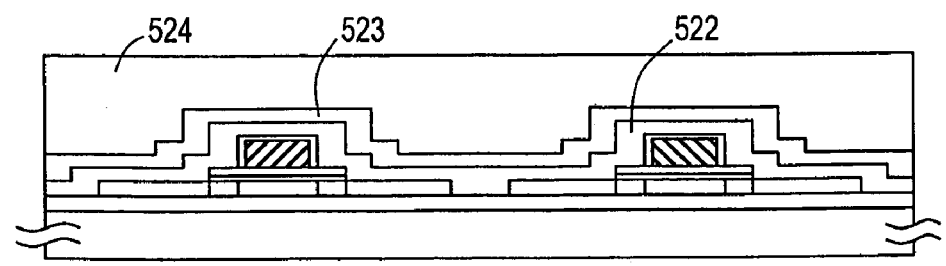
Figure 5F:
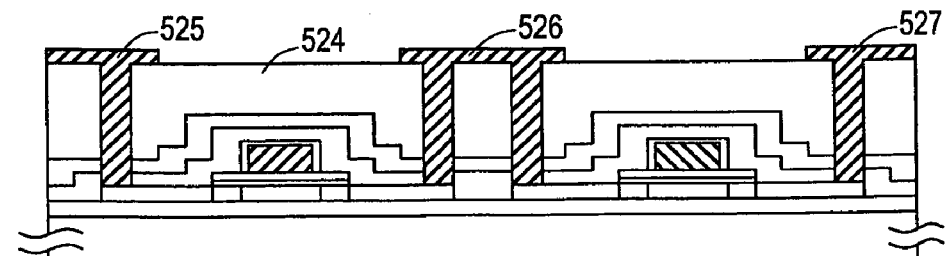

Then, a silicon nitride film 522 and a silicon oxide film 523 are formed as interlayer insulating films as shown in FIG. 5E. Their thickness is 1000 angstrom, respectively. It is noted that the silicon oxide film 523 needs not be formed.

Here, the thin film transistor is covered by the silicon nitride film. The reliability of the thin film transistor may be enhanced by arranging as described above because the silicon nitride film is dense and has a favorite interfacial characteristic.

Further, an interlayer insulating film 524 made of a resin material is formed by means of spin coating. Here, the thickness of the interlayer insulating film 524 is 1 [[≠m]] μm (FIG. 5E).

Then, contact holes are created to form a source electrode 525 and a drain electrode 526 of the N-channel type thin film transistor on the left side. In the same time, a source electrode 527 and the drain electrode 526 of the thin film transistor on the right side are formed. Here, the electrode 526 is disposed in common.

Thus, the thin film transistor circuit having a CMOS structure constructed in a complementary manner may be formed.

According to the arrangement shown in the present embodiment, the thin film transistor is covered by the nitride film as well as the resin material. This arrangement allows to enhance the durability of the thin film transistor to which movable ions nor moisture hardly infiltrate.

Further, it allows to prevent capacitance from being generated between the thin film transistor and wires when a multi-layered wire is formed.

Preferred Embodiment 7

The present embodiment relates to a case when nickel element is introduced directly to the surface of the underlying film in the process shown in the first embodiment. In this case, the nickel element is held in contact with the lower surface of the amorphous silicon film.

In this case, nickel element is introduced after forming the underlying film such that the nickel element (metal element) is held in contact with the surface of the underlying film. Beside the method of using the solution, sputtering, CVD or adsorption may be used as the method for introducing nickel element.

Preferred Embodiment 8

The present embodiment is characterized in that the crystallinity of an island pattern formed of a crystal silicon film obtained by irradiating laser light in the state shown in FIG. 2E, the state shown in FIG. 3A or the state shown in FIG. 4A is improved.

A predetermined annealing effect can be obtained with relatively low irradiation energy density by irradiating the laser light in the state shown in FIGS. 2E, 3A and 4A.

It is considered to have been effected because the laser energy is irradiated to a spot of small area, thus enhancing the efficiency of energy utilized in the annealing.

Preferred Embodiment 9

The present embodiment relates to a case of fabricating a bottom-gate type thin film transistor. FIG. 6 shows the process for fabricating the thin film transistor of the present embodiment. At first, a silicon oxide film 602 is formed as an underlying film on a glass substrate 601.

Figure 6A:
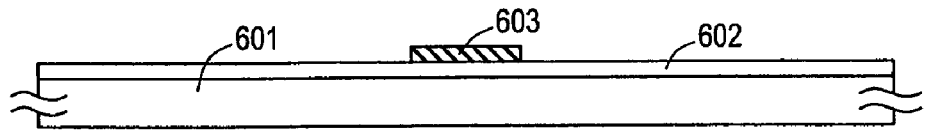
FIG. 6 is a diagram showing steps for fabricating an active layer of the thin film transistor.

Next, a gate electrode 603 is formed by using an adequate metallic material or metallic silicide material (FIG. 6A).

After forming the gate electrode 603, a silicon oxide film 604 which functions as a gate insulating film is formed. Further, an amorphous silicon film 605 is formed.

Figure 6B:
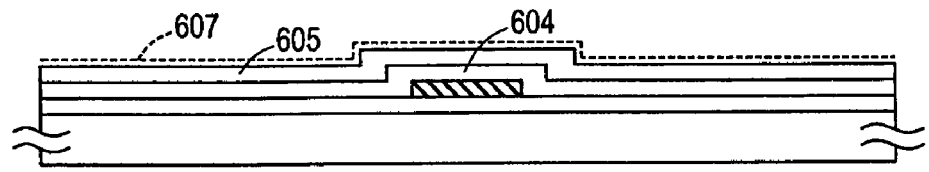

After forming the amorphous silicon film 605, nickel acetate aqueous solution is applied so that nickel element is held in contact on the surface of the amorphous silicon film 605 as indicated by numeral 607 (FIG. 6B).

Next, a heat treatment is implemented within a nitrogen atmosphere containing 3% of hydrogen at 650° C. to crystallize the amorphous silicon film 605 and to obtain a crystal silicon film 606.

Figure 6C:
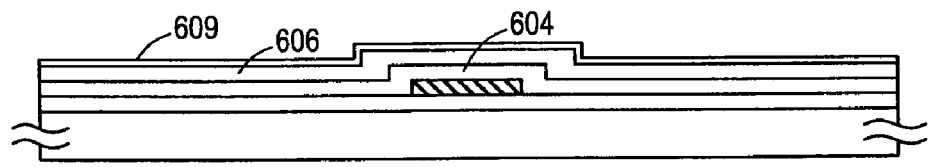

After forming the amorphous silicon film, a heat treatment is implemented within an oxygen atmosphere containing 5% of HCl and 100 ppm (volume) of $NF_3$ at 650° C. A thermal oxide film 609 is formed in this heat treatment (FIG. 6C).

Then, the thermal oxide film 609 is eliminated.

Next, the crystal silicon film 606 and the gate insulating film 604 are patterned to form an active layer 612 of the thin film transistor. Further, a resist mask 610 is placed (FIG. 6D).

Figure 6D:
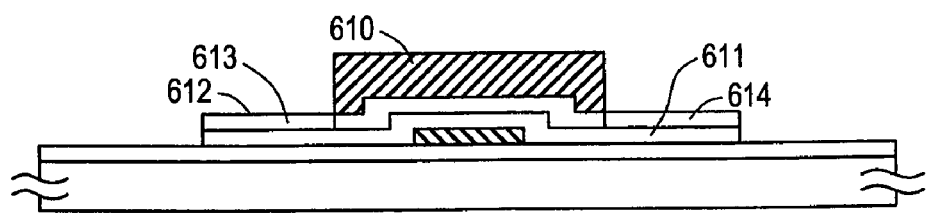

In the state shown in FIG. 6D, impurity ions are injected to form source and drain domains. Here, P (phosphorus) ions are injected in order to fabricate a N-channel type thin film transistor. In this step, the source domain 613 and the drain domain 614 are formed.

After that, isotropic ashing is implemented to cause the resist mask 610 to recede as a whole. That is, the size of the resist mask 610 is reduced as a whole. Thus, the receded resist mask 615 is obtained (FIG. 6E).

Figure 6E:
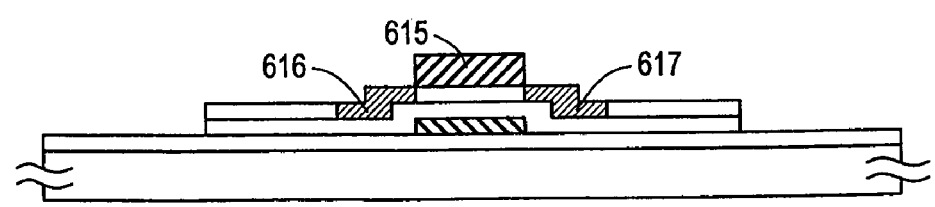
Figure 6F:
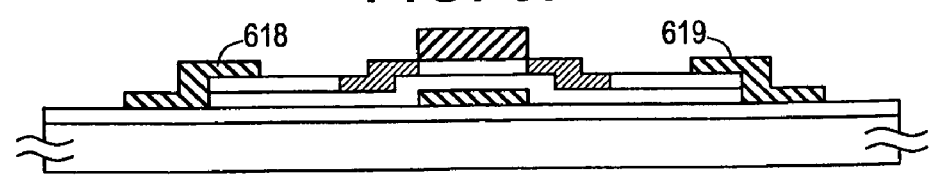

Then, P ions are injected again in the state shown in FIG. 6E. This step is implemented with less dosage than the dosage of P ions in the step in FIG. 6D. Thus, low concentrate impurity domains 616 and 617 are formed.

Next, metallic electrodes 618 and 619 are formed. Here, the electrode 618 is the source electrode and the electrode 619 is the drain electrode. Thus, the bottom-gate type thin film transistor is completed.

The use of the invention disclosed in the present specification allows to provide the technology for reducing the concentration of metal element within the crystal silicon film which has been obtained by utilizing the metal element which promotes the crystallization of silicon.

The use of this technology also allows a more reliable and higher performance thin film semiconductor device to be obtained.

The invention claimed is:

1. A semiconductor device comprising:
   a substrate;
   at least one first insulating film formed over said substrate, said first insulating film comprising silicon oxide;
   a semiconductor film comprising crystalline silicon formed over the first insulating film, said semiconductor film including at least one channel forming region, a source region and a drain region;
   a gate insulating film comprising silicon oxide formed by oxidizing a surface of the semiconductor film;
   a gate electrode formed over the channel forming region with the gate insulating film interposed therebetween;
   a second insulating film comprising silicon nitride formed over said semiconductor film and said gate electrode;

a third insulating film comprising a resin; and
at least one electrode formed over said third insulating film and electrically connected to one of said source region and said drain region.

2. A semiconductor device according to claim 1, wherein said semiconductor film contains hydrogen atoms at a concentration of $1 \times 10^{17}$ cm$^{-3}$ to $1 \times 10^{21}$ cm$^{-3}$.

3. A semiconductor device according to claim 1, wherein said semiconductor film contains oxygen atoms, carbon and nitrogen at a concentration of $2 \times 10^{19}$ cm$^{-3}$ or less, respectively.

4. A semiconductor device according to claim 1, wherein said source and drain regions are not overlapped with said gate insulating film.

5. A semiconductor device according to claim 1, wherein said semiconductor device is an active matrix type liquid crystal display device.

6. A semiconductor device comprising:
a substrate;
at least one first insulating film formed over said substrate, said first insulating film comprising silicon oxide;
a semiconductor film comprising crystalline silicon formed over the first insulating film, said semiconductor film including at least one channel forming region, a source region and a drain region;
a gate insulating film comprising a first layer and a second layer wherein said first layer comprises silicon oxide formed by oxidizing a surface of the semiconductor film and said second layer comprises silicon oxide formed on the first layer:
a gate electrode formed over the channel forming region with the gate insulating film interposed therebetween;
a second insulating film comprising silicon nitride formed over said semiconductor film and said gate electrode;
a third insulating film comprising a resin; and
at least one electrode formed over said third insulating film and electrically connected to one of said source region and said drain region.

7. A semiconductor device according to claim 6, wherein said semiconductor film contains hydrogen atoms at a concentration of $1 \times 10^{17}$ cm$^{-3}$ to $1 \times 10^{21}$ cm$^{-3}$.

8. A semiconductor device according to claim 6, wherein said semiconductor film contains oxygen atoms, carbon and nitrogen at a concentration of $2 \times 10^{19}$ cm$^{-3}$ or less, respectively.

9. A semiconductor device according to claim 6, wherein said source and drain regions are not overlapped with said gate insulating film.

10. A semiconductor device according to claim 6, wherein said semiconductor device is an active matrix type liquid crystal display device.

11. A semiconductor device comprising:
a substrate;
at least one first insulating film formed over said substrate, said first insulating film comprising silicon oxide;
a semiconductor film comprising crystalline silicon formed over the first insulating film, said semiconductor film including at least one channel forming region, a source region, a drain region and at least one lightly doped region;
a gate insulating film comprising silicon oxide formed by oxidizing a surface of the semiconductor film;
a gate electrode formed over the channel forming region with the gate insulating film interposed therebetween;
a second insulating film comprising silicon nitride formed over said semiconductor film and said gate electrode;
a third insulating film comprising a resin; and
at least one electrode formed over said third insulating film and electrically connected to one of said source region and said drain region, and
wherein said lightly doped region has a lower impurity concentration than said source and drain regions.

12. A semiconductor device according to claim 11, wherein said semiconductor film contains hydrogen atoms at a concentration of $1 \times 10^{17}$ cm$^{-3}$ to $1 \times 10^{21}$ cm$^{-3}$.

13. A semiconductor device according to claim 11, wherein said semiconductor film contains oxygen atoms, carbon and nitrogen at a concentration of $2 \times 10^{19}$ cm$^{-3}$ or less, respectively.

14. A semiconductor device according to claim 11, wherein said source and drain regions are not overlapped with said gate insulating film.

15. A semiconductor device according to claim 11, wherein said lightly doped region is overlapped with said gate insulating film.

16. A semiconductor device according to claim 11, wherein said semiconductor device is an active matrix type liquid crystal display device.

17. A semiconductor device comprising:
a substrate;
at least one first insulating film formed over said substrate, said first insulating film comprising silicon oxide;
a semiconductor film comprising crystalline silicon formed over the first insulating film, said semiconductor film including at least one channel forming region, a source region, a drain region and at least one lightly doped region;
a gate insulating film comprising silicon oxide formed by oxidizing a surface of the semiconductor film;
a gate electrode formed over the channel forming region with the gate insulating film interposed therebetween;
a second insulating film comprising silicon nitride formed over said semiconductor film and said gate electrode;
a third insulating film comprising a resin; and
at least one electrode formed over said third insulating film and electrically connected to one of said source region and said drain region,
wherein said lightly doped region has a lower impurity concentration than said source and drain regions, and
wherein said lightly doped region is not overlapped with said gate electrode.

18. A semiconductor device according to claim 17, wherein said semiconductor film contains hydrogen atoms at a concentration of $1 \times 10^{17}$ cm$^{-3}$ to $1 \times 10^{21}$ cm$^{-3}$.

19. A semiconductor device according to claim 17, wherein said semiconductor film contains oxygen atoms, carbon and nitrogen at a concentration of $2 \times 10^{19}$ cm$^3$ or less, respectively.

20. A semiconductor device according to claim 17, wherein said source and drain regions are not overlapped with said gate insulating film.

21. A semiconductor device according to claim 17, wherein said lightly doped region is overlapped with said gate insulating film.

22. A semiconductor device according to claim 17, wherein said semiconductor device is an active matrix type liquid crystal display device.

23. A semiconductor device comprising:
an n-channel type thin film transistor and a p-channel type thin film transistor formed over a substrate in a complementary manner, each of said n-channel type thin film transistor and said p-channel type thin film transistor comprising:
at least one first insulating film formed over said substrate, said first insulating film comprising silicon oxide;

a semiconductor film comprising crystalline silicon formed over the first insulating film, said semiconductor film including at least one channel forming region, a source region and a drain region;
a gate insulating film comprising silicon oxide formed by oxidizing a surface of the semiconductor film;
a gate electrode formed over the channel forming region with the gate insulating film interposed therebetween;
a second insulating film comprising silicon nitride formed over said semiconductor film and said gate electrode;
a third insulating film comprising a resin; and
at least one electrode formed over said third insulating film and electrically connected to one of said source region and said drain region.

24. A semiconductor device according to claim 23, wherein said semiconductor film contains hydrogen atoms at a concentration of $1 \times 10^{17}$ cm$^{-3}$ to $1 \times 10^{21}$ cm$^{-3}$.

25. A semiconductor device according to claim 23, wherein said semiconductor film contains oxygen atoms, carbon and nitrogen at a concentration of $2 \times 10^{19}$ cm$^{-3}$ or less, respectively.

26. A semiconductor device according to claim 23, wherein said source and drain regions are not overlapped with said gate insulating film.

27. A semiconductor device according to claim 23, wherein said semiconductor device is an active matrix type liquid crystal display device.

28. A semiconductor device comprising:
a substrate;
at least one first insulating film formed over said substrate, said first insulating film comprising silicon oxide nitride;
a semiconductor film comprising crystalline silicon formed over the first insulating film, said semiconductor film including at least one channel forming region, a source region and a drain region;
a gate insulating film comprising silicon oxide formed by oxidizing a surface of the semiconductor film;
a gate electrode formed over the channel forming region with the gate insulating film interposed therebetween;
a second insulating film comprising silicon nitride formed over said semiconductor film and said gate electrode;
a third insulating film comprising a resin; and
at least one electrode formed over said third insulating film and electrically connected to one of said source region and said drain region.

29. A semiconductor device according to claim 28, wherein said semiconductor film contains hydrogen atoms at a concentration of $1 \times 10^{17}$ cm$^{-3}$ to $1 \times 10^{21}$ cm$^{-3}$.

30. A semiconductor device according to claim 28, wherein said semiconductor film contains oxygen atoms, carbon and nitrogen at a concentration of $2 \times 10^{19}$ cm$^{-3}$ or less, respectively.

31. A semiconductor device according to claim 28, wherein said source and drain regions are not overlapped with said gate insulating film.

32. A semiconductor device according to claim 28, wherein said semiconductor device is an active matrix type liquid crystal display device.

* * * * *